US008465794B2

(12) United States Patent
Konno et al.

(10) Patent No.: US 8,465,794 B2
(45) Date of Patent: *Jun. 18, 2013

(54) GLASS COMPOSITIONS USED IN CONDUCTORS FOR PHOTOVOLTAIC CELLS

(75) Inventors: Takuya Konno, Kanagawa (JP); Hisashi Matsuno, Tokyo (JP); Brian J. Laughlin, Apex, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 531 days.

This patent is subject to a terminal disclaimer.

(21) Appl. No.: 12/726,693

(22) Filed: Mar. 18, 2010

(65) Prior Publication Data

US 2010/0236621 A1    Sep. 23, 2010

Related U.S. Application Data

(60) Provisional application No. 61/286,855, filed on Dec. 16, 2009, provisional application No. 61/179,864, filed on May 20, 2009, provisional application No. 61/174,085, filed on Apr. 30, 2009, provisional application No. 61/171,479, filed on Apr. 22, 2009, provisional application No. 61/169,333, filed on Apr. 15, 2009, provisional application No. 61/161,455, filed on Mar. 19, 2009.

(51) Int. Cl.
*B05D 5/12*     (2006.01)
*H01L 31/0224*  (2006.01)
*H01L 35/14*    (2006.01)

(52) U.S. Cl.
USPC .............................. 427/74; 427/96.1; 136/252

(58) Field of Classification Search
USPC ............................ 427/74, 96.1; 136/252–256
See application file for complete search history.

(56) References Cited

U.S. PATENT DOCUMENTS

| | | | |
|---|---|---|---|
| 3,350,341 A | 10/1967 | Short | |
| 3,970,590 A * | 7/1976 | Hoffman et al. | 252/514 |
| 4,070,518 A | 1/1978 | Hoffman | |
| 4,361,718 A * | 11/1982 | Marcus et al. | 136/256 |
| 4,375,007 A | 2/1983 | Marcus | |
| 8,262,944 B2 * | 9/2012 | Carroll et al. | 252/514 |
| 2006/0102228 A1 | 5/2006 | Sridharan et al. | |
| 2006/0231800 A1 | 10/2006 | Wang et al. | |
| 2006/0231801 A1 | 10/2006 | Carroll et al. | |
| 2006/0231803 A1 | 10/2006 | Wang et al. | |
| 2006/0231804 A1 | 10/2006 | Wang et al. | |
| 2009/0101199 A1 * | 4/2009 | Carroll et al. | 136/252 |
| 2009/0266409 A1 * | 10/2009 | Wang et al. | 136/252 |
| 2011/0088769 A1 * | 4/2011 | Hang et al. | 136/256 |

FOREIGN PATENT DOCUMENTS

| | | |
|---|---|---|
| JP | 2007-281023 | 10/2007 |
| JP | 2009-099781 | 5/2009 |
| JP | 2009-231826 | 10/2009 |
| SU | 1192295 A1 | 10/1987 |

OTHER PUBLICATIONS

International Search Report for International Application No. PCT/US2010/027804 Dated May 26, 2010.
Goldammer et al., "New Fluoride-Conducting Glass-Ceramics in the System SiO2-PbO-PbF2", Solid State Ionics, May 1, 1994, p. 380-384, vol. 70-71, North Holland Publishing Company, Amsterdam, NL.

* cited by examiner

*Primary Examiner* — Mark Kopec

(57) ABSTRACT

An objective of this present invention is to provide a conductive paste that could obtain good electrical property, for example series resistance in an electrode. An aspect of the present invention relates to a conductive paste which comprises electrically conductive powder; glass frit which comprises, based on weight percent (wt %) of the glass frit, 8-26 wt % of $SiO_2$, 0.1-5 wt % of $Al_2O_3$, and 73-90 wt % of lead compound, wherein lead fluoride is contained in the range of 5-28 wt % based on the total weight of the lead compound; and organic medium.

5 Claims, No Drawings

US 8,465,794 B2

GLASS COMPOSITIONS USED IN CONDUCTORS FOR PHOTOVOLTAIC CELLS

FIELD OF THE INVENTION

Embodiments of the invention relate to a conductive paste used in a conductor for a solar cell device.

TECHNICAL BACKGROUND OF THE INVENTION

An electrode of a silicon solar cell in general requires low electrical resistance to facilitate electrical property of a solar cell.

US 2006/0102228 discloses a solar cell contact made from a mixture wherein the mixture comprises a solids portion and an organic portion, wherein the solids portion comprises from about 85 to about 99 wt % of silver, and from about 1 to about 15 wt % of a glass component wherein the glass component comprises from about 15 to about 75 mol % PbO, from about 5 to about 50 mol % $SiO_2$, and preferably with no $B_2O_3$.

SUMMARY OF THE INVENTION

An objective of the present invention is to provide a conductive paste that could render an electrode formed in the solar cell good electrical property, for example series resistance in an electrode, and to provide a solar cell that has an electrode formed from the conductive paste.

An aspect of the invention relates to a conductive paste for a solar cell electrode which includes an electrically conductive powder; one or more glass frits which include, based on weight percent (wt %) of the glass frit, 8-26 wt % of $SiO_2$, 0.1-5 wt % of $Al_2O_3$, and 73-90 wt % of lead compound, wherein the lead compound includes 5-28 wt % of lead fluoride based on the total weight of the lead compound; and organic medium.

Another aspect of the present invention relates to a method of manufacturing a solar cell electrode including steps of, providing a semiconductor substrate; applying a conductive paste onto the semiconductor substrate, wherein the conductive paste includes: electrically conductive powder, one or more glass frits which include, based on weight percent (wt %) of the glass frit, 8-26 wt % of $SiO_2$, 0.1-5 wt % of $Al_2O_3$, and 73-90 wt % of lead compound, wherein the lead compound include 5-28 wt % of lead fluoride based on the total weight of the lead compound; and organic medium; and firing the conductive paste. An aspect of the invention relates to a solar cell electrode made by this method. An aspect of the invention relates to a solar cell electrode, wherein, prior to firing, the solar cell electrode includes the conductive paste.

An aspect of the invention relates to a conductive paste for a solar cell electrode including: an electrically conductive powder; a glass frit which includes, based on weight percent (wt %) of the glass frit: 8-26 wt % of $SiO_2$, 0.1-5 wt % of $Al_2O_3$, and 1 to 5 elemental wt % fluorine; and organic medium.

DETAILED DESCRIPTION OF THE INVENTION

A conductive paste for a solar cell electrode of the present invention includes electrically conductive powder, glass frit and organic medium. The conductive paste is described below as well as a method of manufacturing a solar cell electrode made of the conductive paste.

Glass Frit

Glass frits used in the pastes described herein promote sintering of the electrically conductive powder and also to facilitate binding of the electrode to the substrate.

Glass compositions, also termed glass frits, are described herein as including percentages of certain components (also termed the elemental constituency). Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of skill in the art in glass chemistry, a certain portion of volatile species may be released during the process of making the glass. An example of a volatile species is oxygen.

If starting with a fired glass, one of skill in the art may calculate the percentages of starting components described herein (elemental constituency) using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mossbauer spectroscopy; Electron microprobe Energy Dispersive Spectroscopy (EDS); Electron microprobe Wavelength Dispersive Spectroscopy (WDS); Cathodoluminescence (CL).

The glass compositions described herein, including those listed in Table I, are not limiting; it is contemplated that one of ordinary skill in the art of glass chemistry could make minor substitutions of additional ingredients and not substantially change the desired properties of the glass composition. For example, substitutions of glass formers such as $P_2O_5$ 0-3, $GeO_2$ 0-3, $V_2O_5$ 0-3 in weight % may be used either individually or in combination to achieve similar performance. For example, one or more intermediate oxides, such as $TiO_2$, $Ta_2O_5$, $Nb_2O_5$, $ZrO_2$, $CeO_2$, and $SnO_2$ may be substituted for other intermediate oxides (i.e., $Al_2O_3$, $CeO_2$, $SnO_2$) present in a glass composition.

An aspect relates to glass frit compositions including one or more fluorine-containing components, including but not limited to: salts of fluorine, fluorides, metal oxyfluoride compounds, and the like. Such fluorine-containing components include, but are not limited to $BiF_3$, $AlF_3$, NaF, LiF, KF, CsF, $ZrF_4$, and/or $TiF_4$.

In an embodiment, glass frit described herein includes 8-26 wt % of Silicon dioxide ($SiO_2$), 0.1-5 wt % of Aluminum oxide ($Al_2O_3$) and 73-90 wt % of lead (Pb) compound, based on the total weight of the glass frit. The lead compound contains 5-28 wt % of lead fluoride based on the total weight of the lead compound. In an embodiment, the $SiO_2$ is 10-25 wt %, in a further embodiment, the $SiO_2$ is 12-20 wt %. In an embodiment, the $Al_2O_3$ is 0.1-3 wt %, in a further embodiment, the $Al_2O_3$ is 0.2-2 wt %.

As used herein, "lead compound" means a compound including lead. In a non-limiting embodiment, the lead compound includes lead and another element such as oxygen or fluorine.

In a non-limiting embodiment, a lead compound may melt by heating at a peak temperature of 800-1400° C. in a mixture with other glass forming constituents. In an embodiment, a lead compound may be selected from the group including, but not limited to, lead oxide (PbO), lead dioxide ($PbO_2$), lead (IV) oxide (PbO$_4$), lead tetraoxide (Pb$_3$O$_4$), lead fluoride(I) (PbF), lead fluoride(II) (PbF$_2$), lead fluoride(IV) (PbF$_4$), Lead(II) bromide, lead chloride (PbCl$_2$), Lead(II) bromide (PbBr$_2$), lead (II) nitrate (Pb(NO$_3$)$_2$, lead (IV) nitrate (Pb(NO$_3$)$_4$, lead carbonate (PbCO$_3$) and mixture thereof. In an embodiment, a lead compound may be selected from the group including: PbO and PbF$_2$. In an embodiment, the lead compound may be at least 73 wt % of the glass frit; in a further embodiment, the lead compound may be at least 78 wt % of the glass frit. In an embodiment, the lead compound may be less than 88 wt % of the glass frit; in a further embodiment, the lead compound may be less than 85 wt % of the glass frit. In an embodiment, glass frits including a lead compound may have a higher Ts, as shown in Table 3.

As described herein, "lead fluoride" means a compound including lead and fluoride. In a non-limiting embodiment, lead fluoride may melt by heating at a peak temperature of 800-1400° C. in a mixture with other glass forming constituents. In an embodiment, lead fluoride may be selected from the group including, but not limited to, PbF, PbF$_2$, PbF$_4$ and mixtures thereof. In an embodiment the lead fluoride may be PbF$_2$. In an embodiment, the lead fluoride may be at least 7 wt % of the lead compound; in a further embodiment, the lead fluoride may be at least 10 wt % of the lead compound. In an embodiment, the lead fluoride may be less than 20 wt % of the lead compound; in a further embodiment, the lead fluoride may be less than 18 wt % of the lead compound.

In experiments conducted of glass compositions described herein, it was found that many of glass frits which contain about 15 wt % lead fluoride based on the lead compound displayed stability of an amorphous glass (lack of crystallinity) upon firing at 0-800° C.

In another embodiment, the glass frit composition(s) herein may include one or more of a second set of components selected from the group consisting of B$_2$O$_3$, Na$_2$O$_3$, Li$_2$O, ZrO$_2$, CuO, TiO$_2$ and Bi$_2$O$_3$. In an embodiment, the glass frit composition(s) may include one or more of B$_2$O$_3$ and ZrO$_2$.

In an embodiment, B$_2$O$_3$ may be 0.5-5.0 wt %; 1.0-3.0 wt %; or 1.2-2.5 wt % of the glass frit. In an embodiment, ZrO$_2$ may be 0.1-5.0 wt %; 0.2-2.0 wt %; or 0.2-1.0 wt % of the glass frit.

The glass compositions used herein, in weight percent total glass composition, are shown in Table 1. Unless stated otherwise, as used herein, wt % means wt % of glass composition only. Specimens of lead compound containing glasses described on an oxide and fluoride salt basis are shown in Table 1.

TABLE 1

| | SiO$_2$ | Al$_2$O$_3$ | PbO | B$_2$O$_3$ | CaO | ZnO | MgO | Na$_2$O | FeO | Li$_2$O | Ta$_2$O$_3$ | ZrO$_2$ | Bi$_2$O$_3$ | TiO$_2$ | CuO | PbF$_2$ | F2O5 |
|---|---|---|---|---|---|---|---|---|---|---|---|---|---|---|---|---|---|
| 1 | 18.95 | 0.98 | 56.39 | 1.92 | | | | | | | | 0.48 | | | | 21.28 | |
| 2 | 12.83 | 0.37 | 65.14 | | | | | | | | | 0.37 | | | | 21.29 | |
| 3 | 18.89 | 0.95 | 56.21 | 1.92 | | | | 0.11 | | 0.21 | | 0.48 | | | | 21.23 | |
| 4 | 12.80 | 0.37 | 64.86 | | | | | 0.09 | | 0.18 | | 0.37 | | | | 21.24 | |
| 5 | 18.95 | 0.98 | 52.90 | 1.92 | | | | | | | | 0.48 | | | | 24.78 | |
| 6 | 12.83 | 0.37 | 81.84 | | | | | | | | | 0.37 | | | | 24.78 | |
| 7 | 18.89 | 0.95 | 52.71 | 1.92 | | | | 0.11 | | 0.21 | | 0.48 | | | | 24.73 | |
| 8 | 12.80 | 0.37 | 81.45 | | | | | 0.09 | | 0.18 | | 0.37 | | | | 24.74 | |
| 9 | 15.42 | 0.20 | 79.71 | 1.82 | | | | 0.10 | | 0.25 | | 0.41 | | 2.55 | | | |
| 10 | 19.48 | 0.97 | 84.90 | 1.94 | | | | | | | | 0.49 | | | | 12.54 | |
| 11 | 12.97 | 0.37 | 73.78 | | | | | | | | | 0.37 | | | | 12.53 | |
| 12 | 29.21 | 0.49 | 45.01 | | | | | | | | | 0.50 | | | | 24.79 | |
| 13 | 29.54 | 0.50 | 55.52 | | | | | | | | | 0.51 | | | | 12.53 | |
| 14 | 21.25 | 0.37 | 31.55 | 7.19 | | | | 0.15 | | 0.25 | | | 6.55 | 5.64 | 2.65 | 24.09 | |
| 15 | 21.79 | 0.38 | 32.93 | 7.39 | | | | 0.15 | | 0.25 | | | 6.71 | 5.78 | | 24.86 | |
| 16 | 22.28 | 0.39 | 43.56 | 7.54 | | | | 0.13 | | 0.25 | | | 5.55 | 2.10 | 2.62 | 14.31 | |
| 17 | 22.86 | 0.40 | 44.83 | 7.75 | | | | 0.13 | | 0.25 | | | 7.04 | 2.35 | | 14.80 | |
| 18 | 15.45 | 0.42 | 50.88 | 3.30 | | | | | | | | | 7.40 | 6.38 | | 9.45 | 6.73 |
| 19 | 21.25 | 0.37 | 44.93 | 3.60 | | | | | | | | | 6.54 | 5.84 | | 10.32 | 7.35 |
| 20 | 20.48 | 0.38 | 43.31 | | | | | | | | | | 6.30 | 5.43 | | 9.25 | 14.16 |
| 21 | 19.10 | 0.97 | 64.89 | 1.93 | | | | 0.11 | | 0.21 | | 0.49 | | | | 12.50 | |
| 22 | 12.93 | 0.37 | 73.55 | | | | | 0.10 | | 0.18 | | 0.37 | | | | 12.50 | |
| 23 | 15.81 | 0.65 | 69.45 | 0.90 | | | | 0.10 | | 0.19 | | 0.43 | | | | 12.50 | |
| 24 | 15.77 | 0.41 | 89.03 | 1.89 | | | | | | | | 0.41 | | | | 12.50 | |
| 25 | 15.84 | 0.41 | 68.31 | 1.87 | | | | | | | | | | | | 12.55 | |
| 26 | 15.75 | 0.57 | 69.00 | 1.88 | | | | | | | | | | | | 12.49 | |
| 27 | 15.65 | 1.34 | 68.67 | 1.87 | | | | | | | | | | | | 12.43 | |

The glass compositions can be described alternatively in wt % of the elements of the glass composition as seen in Table 2. In one embodiment the glass may be, in part:
Silicon: 1 to 15 elemental wt %, 1 to 10 elemental wt %, or 5 to 9 elemental wt %,
Aluminum: 0.1 to 1.0 elemental wt %, 0.1 to 0.75 elemental wt %, or 0.2 to 0.55 elemental wt %,
Fluorine: 0 to 5 elemental wt %, 1 to 5 elemental wt %, or 1.5 to 3.5 elemental wt %,
Lead: 45 to 85 elemental wt %, 60 to 80 elemental wt %, or 70 to 80 elemental wt %,
Bismuth: 0 to 10 elemental wt %, 1 to 9 elemental wt %, 5 to 7 elemental wt %,
Zirconium: 0 to 1 elemental wt %, 0 to 0.5 elemental wt %, or 0.25 to 0.35 elemental wt %,
Boron: 0 to 3 elemental wt %, 0 to 1 elemental wt %, or 0.25 to 0.75 elemental wt %,
Titanium: 0 to 4 elemental wt %, 0.5 to 4 elemental wt %, or 1 to 3 elemental wt %,
Lithium: 0 to 0.25 elemental wt %, 0.01 to 0.1 elemental wt %, or 0.05 to 0.1 elemental wt %,
Sodium: 0 to 0.25 elemental wt %, 0.01 to 0.1 elemental wt %, or 0.05 to 0.1 elemental wt %, or
Potassium: 0 to 0.25 elemental wt %, 0.01 to 0.1 elemental wt %, or 0.05 to 0.1 elemental wt %.
In this embodiment the total amount of alkali elements (including but not limited to Na, Li, and K) may be 0 to 0.25 elemental wt %, 0.01 to 0.1 elemental wt %, or 0.05 to 0.111 elemental wt %.

Specimens of lead compound containing glasses described on an elemental basis are shown in Table 2.

TABLE 2

| | Si | Al | Zr | B | Cu | Ti | Na | Bi | Li | P | Pb | F | O |
|---|---|---|---|---|---|---|---|---|---|---|---|---|---|
| 1 | 8.86 | 0.51 | 0.36 | 0.60 | | | | | | | 70.34 | 3.30 | 16.04 |
| 2 | 6.00 | 0.19 | 0.27 | | | | | | | | 78.46 | 3.30 | 11.77 |
| 3 | 8.83 | 0.50 | 0.36 | 0.60 | | | 0.08 | | 0.10 | | 70.12 | 3.29 | 16.13 |
| 4 | 5.98 | 0.19 | 0.27 | | | 0.07 | | | 0.08 | | 78.25 | 3.29 | 11.86 |
| 5 | 8.86 | 0.51 | 0.36 | 0.60 | | | | | | | 70.05 | 3.84 | 15.79 |
| 6 | 6.00 | 0.20 | 0.27 | | | | | | | | 78.17 | 3.84 | 11.52 |
| 7 | 8.83 | 0.50 | 0.36 | 0.60 | | | 0.08 | | 0.10 | | 69.83 | 3.83 | 15.88 |
| 8 | 5.98 | 0.20 | 0.27 | | | 0.07 | | | 0.08 | | 77.95 | 3.83 | 11.61 |
| 9 | 7.21 | 0.10 | 0.30 | 0.57 | 1.72 | 0.07 | | | 0.09 | | 73.99 | 0.00 | 15.94 |
| 10 | 8.96 | 0.51 | | 0.60 | | | | | | | 70.84 | 1.94 | 16.78 |
| 11 | 6.06 | 0.20 | 0.27 | | | | | | | | 79.06 | 1.94 | 12.47 |
| 12 | 13.65 | 0.26 | 0.37 | | | | | | | | 62.73 | 3.84 | 19.14 |
| 13 | 13.81 | 0.26 | 0.38 | | | | | | | | 63.43 | 1.94 | 20.18 |
| 14 | 9.91 | 0.19 | | 2.23 | 2.12 | 3.38 | 0.10 | 5.85 | 0.12 | | 50.02 | 3.73 | 22.35 |
| 15 | 10.18 | 0.20 | | 2.30 | | 3.46 | 0.09 | 6.01 | 0.11 | | 51.41 | 3.82 | 22.41 |
| 16 | 10.41 | 0.21 | | 2.34 | 2.09 | 1.26 | 0.10 | 6.14 | 0.11 | | 52.52 | 2.22 | 22.60 |
| 17 | 10.69 | 0.21 | | 2.41 | | 1.29 | 0.09 | 6.31 | 0.11 | | 53.95 | 2.26 | 22.67 |
| 18 | 7.22 | 0.22 | | 1.02 | | 3.83 | | 6.64 | | 2.94 | 55.21 | 1.46 | 21.45 |
| 19 | 9.93 | 0.20 | | 1.12 | | 3.38 | | 5.86 | | 3.21 | 50.43 | 1.60 | 24.27 |
| 20 | 9.58 | 0.19 | | | | 3.26 | | 5.65 | | 6.18 | 48.61 | 1.54 | 24.99 |
| 21 | 8.93 | 0.51 | 0.36 | 0.60 | | | 0.08 | | 0.10 | | 70.62 | 1.94 | 16.86 |
| 22 | 6.04 | 0.20 | 0.27 | | | 0.07 | | | 0.08 | | 78.84 | 1.94 | 12.55 |
| 23 | 7.39 | 0.34 | 0.32 | 0.28 | | 0.08 | | | 0.09 | | 75.00 | 1.94 | 14.57 |
| 24 | 7.37 | 0.22 | 0.30 | 0.58 | | | | | | | 74.64 | 1.94 | 14.94 |
| 25 | 7.40 | 0.22 | | 0.59 | | | | | | | 74.95 | 1.94 | 14.90 |
| 26 | 7.37 | 0.46 | | 0.58 | | | | | | | 74.61 | 1.94 | 15.05 |
| 27 | 7.33 | 0.71 | | 0.58 | | | | | | | 74.25 | 1.93 | 15.20 |

In another embodiment, the glass frits may have a softening point in a range of 300-450° C. The glass frits may have the softening point less than 435° C., or less than 400° C. In this specification, "softening point" is determined by differential thermal analysis (DTA). To determine the glass softening point by DTA, sample glass is ground and is introduced with a reference material into a furnace to be heated at a constant rate of 5 to 20° C. per minute. The difference in temperature between the two is detected to investigate the evolution and absorption of heat from the material. In general, the first evolution peak is on glass transition temperature (Tg), the second evolution peak is on glass softening point (Ts), the third evolution peak is on crystallization point. When a glass frit is a noncrystalline glass, the crystallization point would not appear in DTA.

In another embodiment, the glass frit may be a noncrystalline glass upon firing at 0-800° C. In this specification, "noncrystalline glass" is determined by DTA as described above. The third evolution peak would not appear upon firing at 0-800° C. in a noncrystalline glass DTA.

The glass frits described herein can be manufactured by conventional glass making techniques. The following procedure is one example. Ingredients are weighed then mixed in the desired proportions and heated in a furnace to form a melt in platinum alloy crucibles. As well known in the art, heating is conducted to a peak temperature (800-1400° C.) and for a time such that the melt becomes entirely liquid and homogeneous. The molten glass is then quenched between counter rotating stainless steel rollers to form a 10-15 mil thick platelet of glass. The resulting glass platelet is then milled to form a powder with its 50% volume distribution set between to a desired target (e.g. 0.8-1.5 μm). One skilled the art of producing glass frit may employ alternative synthesis techniques such as but not limited to water quenching, sol-gel, spray pyrolysis, or others appropriate for making powder forms of glass. US patent application numbers US 2006/231803 and US 2006/231800, which disclose a method of manufacturing a glass useful in the manufacture of the glass frits described herein, are hereby incorporated by reference herein in their entireties.

One of skill in the art would recognize that the choice of raw materials could unintentionally include impurities that may be incorporated into the glass during processing. For example, the impurities may be present in the range of hundreds to thousands ppm.

The presence of the impurities would not alter the properties of the glass, the thick film composition, or the fired device. For example, a solar cell containing the thick film composition may have the efficiency described herein, even if the thick film composition includes impurities.

Conductive Powder

The conductive paste includes electrically functional powders dispersed in an organic medium that acts as a carrier for the functional phase that forms the composition. The composition is fired to burn out the organic phase, activate the inorganic binder phase and to impart the electrically functional properties.

In an embodiment, the conductive powder may include silver (Ag). In another embodiment, the conductive powder may include silver and aluminum (Al). In another embodiment, the conductive powder may include one or more of the following: Cu, Au, Ag, Pd, Pt, Al, Pd. In an embodiment, the conductive powder may include one or more of the following: (1) Cu, Au, Ag, Pd, Pt, Al and Pd; (2) alloy of Cu, Au, Ag, Pd, Pt, Al and Pd; and (3) mixtures thereof.

In an embodiment, the conductive powder may be coated or uncoated silver particles which are electrically conductive. In an embodiment in which the silver particles are coated, they may be at least partially coated with a surfactant. In an embodiment, the surfactant may include one or more selected from the group consisting of stearic acid, palmitic acid, a salt of stearate, a salt of palmitate, lauric acid, palmitic acid, oleic acid, stearic acid, capric acid, myristic acid and linoleic acid, and mixtures thereof. Counter ion of the surfactant may be, but is not limited to, hydrogen, ammonium, sodium, potassium and mixtures thereof.

In an embodiment, the average particle size may be less than 10 microns; in an embodiment, the average particle size may be less than 5 microns. The average particle size may be 0.1 to 5 microns, for example. Average particle size may be measured by laser diffraction using Microtrac S3500, for example.

The electrically conductive powder may be 40-90 wt % of the conductive paste. The silver may be 90 to 99 wt % of the solids in the composition (i.e., excluding the organic vehicle).

Organic Medium

In an embodiment, the conductive pastes described herein may include organic medium. The inorganic components may be mixed with an organic medium, for example, by mechanical mixing to form viscous compositions called "pastes", having suitable consistency and rheology for printing.

A wide variety of inert viscous materials can be used as organic medium. The organic medium may be one in which the inorganic components are dispersible with an adequate degree of stability. The rheological properties of the medium may lend certain application properties to the composition, including: stable dispersion of solids, appropriate viscosity and thixotropy for screen printing, appropriate wettability of the substrate and the paste solids, a good drying rate, and good firing properties. The organic vehicle used in the conductive paste of the present invention may be a nonaqueous inert liquid. The use of various organic vehicles, which may or may not contain thickeners, stabilizers and/or other common additives, is contemplated. The organic medium may be a solution of polymer(s) in solvent(s). The organic medium may also include one or more components, such as surfactants. The polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. The solvents useful in conductive pastes described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In a further embodiment, the organic medium may include volatile liquids for promoting rapid hardening after application on the substrate.

In an embodiment, the polymer may be present in the organic medium in the range of 8 wt % to 11 wt % of the organic medium, for example. Conductive paste of the present invention may be adjusted to a predetermined, screen-printable viscosity with the organic medium.

In an embodiment, the ratio of organic medium in the conductive paste to the inorganic components in the dispersion may be dependent on the method of applying the paste and the kind of organic medium used, as determined by one of skill in the art. In an embodiment, the dispersion may include 70-95 wt % of inorganic components and 5-30 wt % of organic medium (vehicle) in order to obtain good wetting.

Description of Method of Manufacturing a Semiconductor Device

An embodiment of the invention relates to conductive paste that may be utilized in the manufacture of a solar cell electrode. The semiconductor device may be manufactured by the following method from a structural element composed of a junction-bearing semiconductor substrate and a silicon nitride insulating film formed on a main surface thereof.

The method of manufacture of a solar cell electrode includes steps of applying (such as coating and printing) a conductive paste onto a semiconductor substrate, and firing. The semiconductor substrate may be a silicon substrate. The semiconductor substrate may have an insulating film. The conductive paste as described above would be used in the method of a solar cell electrode of the present invention.

In the firing step, the paste may be fired in an IR heating type of belt furnace. Firing time depends on the firing temperature and the belt speed. However, the firing time which counts from an entrance and exit of the furnace (IN-OUT), may be longer than 40 seconds and less than 5 minutes; or less than 3 minutes. When a semiconductor substrate is fired for more than 5 minutes, damage may result. In an embodiment, firing temperature may be less than 930° C.; less than 910° C.; or less than 890° C. A firing temperature of greater than 930° C. may result in damage to the semiconductor substrate. In an embodiment, the conductive paste melts, penetrates the insulating film, and sinters, effecting electrical contact with the semiconductor substrate.

In an embodiment, the method of manufacture of a solar cell electrode may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film may be formed by coating a titanium-containing organic liquid material onto the semiconductor substrate and firing, or by a thermal CVD. The silicon nitride film is typically formed by PECVD (plasma enhanced chemical vapor deposition). An embodiment of the invention relates to a solar cell electrode manufactured from the method described above.

In an embodiment, the electrode formed from the conductive paste(s) of the present invention may be fired in an atmosphere composed of a mixed gas of oxygen and nitrogen. This firing process removes the organic medium and sinters the glass frit with the Ag powder in the conductive paste. The semiconductor substrate may be single-crystal or multicrystalline silicon, for example.

Additional substrates, devices, methods of manufacture, and the like, which may be utilized with a conductive pastes described herein are described in US patent application publication numbers US 2006/0231801, US 2006/0231804, and US 2006/0231800, which are hereby incorporated herein by reference in their entireties.

EXAMPLES

The present invention is illustrated by, but is not limited to, the following examples.

Glass Property Measurement

Glass frits in Table 3 selected from Table 1 were characterized to determine softening point and crystallinity by DTA as explained above in this specification. Ts about each glass frit is shown in Table 3.

Paste Preparation

Paste preparations were accomplished with the following procedure: Appropriate amounts of organic medium, Ag powder and glass frit were weighed. The glass frits described herein was added to the organic medium and mixed for 15 minutes. Since Ag powder was the major part of the solids of the present invention, it was added incrementally to the mixture of glass frit and organic medium to ensure better wetting. When well mixed, the paste was repeatedly passed through a 3-roll mill for at progressively increasing pressures from 0 to 400 psi. The gap of the rolls was adjusted to 1 mil. The degree of dispersion was measured by fineness of grind (FOG). A typical FOG value was generally equal to or less than 20/10 for a conductor.

Manufacture of Test Pieces

The conductive pastes obtained by the above method were screen printed on Si wafers (38 mm×38 mm). The conductive pastes printed onto the wafers were dried at 150° C. for 5 min in a convection oven. Electrodes were then obtained upon being sintered in an IR heating type of belt furnace. The belt speed during sintering was 550 cpm. IN-OUT Sintering time was 60 seconds. Sintering temperature was less than 900° C., 400-600° C. for 15 seconds and over 600° C. for 6 seconds.

Test Procedure-Efficiency

The solar cell electrodes built according to the method described above was tested for series resistance (Rs). Rs was tested by following method. The solar cell built according to the method described herein was placed in a commercial IV tester for measuring electrical property (ST-1000). Xenon (Xe) Arc lamp in the IV tester simulated the sunlight with a known intensity and radiated the front surface of the cell. The tester used a four contact method to measure current (I) and voltage (V) at approximately 400 load resistance settings to determine the cell's I-V curve. Rs was calculated from the I-V curve. Rs was normalized to corresponding values obtained with cells contacted with a conventional conductive paste as a reference. "Relative Rs" in Table 3 were calculated by (Rs of example minus Rs of reference)/Rs of reference×100.

Results

In example 1-5, solar cell electrodes obtained lower Rs, while comparative examples obtained higher Rs. The glass frits in comparative example 4 to 9 render the high Rs to solar cell electrodes. The glass frits in example 2, which contained 81.53 wt % of PbO and PbF and 15.3 wt % of PbF out of that 81.53 wt %, obtained the lowest Rs. All of solar cell electrodes in example 1-5 obtained better Rs, therefore a solar cell having an electrode formed with the present invention could obtain better electrical property.

TABLE 3

| | $SiO_2$ | $Al_2O_3$ | PbO | $B_2O_3$ | $Na_2O$ | $Li_2O$ | $ZrO_2$ | $Bi_2O_3$ | $TiO_2$ | CuO | $PbF_2$ | total | $PbO + PbF_2$ | $PbF_2/(PbO + PbF_2)$ | Ts (° C.) | Relative Rs |
|---|---|---|---|---|---|---|---|---|---|---|---|---|---|---|---|---|
| Comparative Example 1 | 18.95 | 0.96 | 52.90 | 1.92 | | | 0.48 | | | | 24.79 | 100.00 | 77.69 | 31.9 | 405 | 15.2 |
| Comparative Example 2 | 12.83 | 0.37 | 61.64 | | | | 0.37 | | | | 24.79 | 100.00 | 86.43 | 28.7 | 330 | 14.4 |
| Comparative Example 3 | 15.42 | 0.20 | 79.71 | 1.82 | 0.10 | 0.20 | 0.41 | | 2.15 | | | 100.00 | 79.71 | 0.0 | 420 | 2.2 |
| Comparative Example 4 | 29.21 | 0.49 | 45.01 | | | | 0.50 | | | | 24.79 | 100.00 | 69.80 | 35.5 | 465 | 719.0 |
| Comparative Example 5 | 29.54 | 0.50 | 56.92 | | | | 0.51 | | | | 12.53 | 100.00 | 69.45 | 18.0 | 489 | 733.6 |
| Comparative Example 6 | 22.86 | 0.40 | 44.83 | 7.75 | 0.13 | 0.25 | | 7.04 | 2.15 | | 14.60 | 100.00 | 59.43 | 24.6 | 483 | 1.88 |
| Comparative Example 7 | 22.26 | 0.39 | 43.56 | 7.54 | 0.13 | 0.25 | | 6.85 | 2.10 | 2.62 | 14.31 | 100.00 | 57.86 | 24.7 | 474 | 12.44 |
| Comparative Example 8 | 21.79 | 0.38 | 32.93 | 7.39 | 0.13 | 0.25 | | 6.71 | 5.78 | | 24.66 | 100.00 | 57.59 | 42.8 | 478 | 0.21 |
| Comparative Example 9 | 21.20 | 0.37 | 31.95 | 7.19 | 0.13 | 0.25 | | 6.53 | 5.64 | 2.65 | 24.09 | 100.00 | 56.04 | 43.0 | 483 | 4.24 |
| Example 1 | 12.97 | 0.37 | 73.76 | | | | 0.37 | | | | 12.53 | 100.00 | 86.29 | 14.5 | 376 | −0.5 |
| Example 2 | 15.77 | 0.41 | 69.03 | 1.88 | | | 0.41 | | | | 12.50 | 100.00 | 81.53 | 15.3 | 386 | −11.1 |
| Example 3 | 15.84 | 0.41 | 69.31 | 1.89 | | | | | | | 12.55 | 100.00 | 81.86 | 15.3 | 383 | −1.9 |
| Example 4 | 15.76 | 0.87 | 69.00 | 1.88 | | | | | | | 12.49 | 100.00 | 81.49 | 15.3 | 390 | −4.7 |
| Example 5 | 19.16 | 0.97 | 64.90 | 1.94 | | | 0.49 | | | | 12.54 | 100.00 | 77.44 | 16.2 | 428 | −0.8 |

What is claimed is:

1. A method of manufacturing a solar cell electrode comprising steps of:
   providing a semiconductor substrate;
   applying a conductive paste onto the semiconductor substrate, wherein the conductive paste comprises, electrically conductive powder, glass frit which comprises, based on weight percent (wt %) of the glass frit:
   8-26 wt % of SiO2,
   0.1-5 wt % of Al2O3,
   0.5-5.0 wt % of $B_2O_3$, and
   73-90 wt % of lead compound, wherein the lead compound comprises 5-18 wt % of lead fluoride based on the total weight of the lead compound; and
   organic medium; and
   firing the conductive paste.

2. The method of manufacturing a solar cell electrode of claim 1, wherein the conductive paste is fired at a temperature of less than 930° C.

3. The method of claim 1, wherein the conductive paste is fired for 2-5 minutes.

4. A solar cell electrode manufactured by the method of claim 1.

5. A solar cell comprising the solar cell electrode claim 4.

* * * * *